(12) United States Patent
Van Leeuwen et al.

(10) Patent No.: US 11,999,645 B2
(45) Date of Patent: Jun. 4, 2024

(54) OPTICAL FIBERS AND PRODUCTION METHODS THEREFOR

(71) Applicant: ASML NETHERLANDS B.V., Veldhoven (NL)

(72) Inventors: Robbert Edgar Van Leeuwen, Eindhoven (NL); Amir Abdolvand, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 571 days.

(21) Appl. No.: 17/287,015

(22) PCT Filed: Oct. 3, 2019

(86) PCT No.: PCT/EP2019/076832
§ 371 (c)(1),
(2) Date: Apr. 20, 2021

(87) PCT Pub. No.: WO2020/083624
PCT Pub. Date: Apr. 30, 2020

(65) Prior Publication Data
US 2021/0387892 A1 Dec. 16, 2021

(30) Foreign Application Priority Data
Oct. 24, 2018 (EP) .................................... 18202368
Nov. 5, 2018 (EP) .................................... 18204375

(51) Int. Cl.
*C03B 37/00* (2006.01)
*C03B 37/012* (2006.01)
(Continued)

(52) U.S. Cl.
CPC .... *C03B 37/0122* (2013.01); *C03B 37/01228* (2013.01); *C03B 37/02781* (2013.01);
(Continued)

(58) Field of Classification Search
CPC .......... C03B 37/0122; C03B 37/01228; C03B 37/02781; C03B 2203/16; C03B 2203/42;
(Continued)

(56) References Cited

U.S. PATENT DOCUMENTS 6,444,133 B1 * 9/2002 Fajardo .............. G02B 6/02328
65/393
6,952,253 B2 10/2005 Lof et al.
(Continued)

FOREIGN PATENT DOCUMENTS

| CN | 1892439 | 1/2007 |
|---|---|---|
| CN | 101836143 | 9/2010 |

(Continued)

OTHER PUBLICATIONS

Japanese Office Action issued in corresponding Japanese Patent Application No. 2021-520974, dated Sep. 1, 2022.
(Continued)

*Primary Examiner* — Michael Maskell
(74) *Attorney, Agent, or Firm* — Pillsbury Winthrop Shaw Pittman, LLP

(57) ABSTRACT

An optical fiber, manufacturing intermediate for forming an optical fiber and a method for forming an optical fiber. The method includes providing a manufacturing intermediate having an elongate body and having an aperture extending through the elongate body along an axial dimension of the elongate body, a boundary of the aperture defining an internal surface of the manufacturing intermediate. The method further includes etching the internal surface of the manufacturing intermediate using an etching substance, and drawing the manufacturing intermediate along the axial dimension so as to form the optical fiber.

21 Claims, 7 Drawing Sheets

(51) Int. Cl.
  *C03B 37/027* (2006.01)
  *C03C 25/68* (2006.01)
  *G01N 21/956* (2006.01)
  *G02F 1/35* (2006.01)
  *G02F 1/365* (2006.01)
  *G03F 7/00* (2006.01)

(52) U.S. Cl.
  CPC ........... *C03C 25/68* (2013.01); *G01N 21/956* (2013.01); *G02F 1/3528* (2021.01); *G02F 1/365* (2013.01); *G03F 7/70316* (2013.01); *C03B 2203/16* (2013.01); *C03B 2203/42* (2013.01)

(58) Field of Classification Search
  CPC .......... C03B 2203/14; C03B 37/01245; C03C 25/68; G01N 21/956; G01N 2021/8809; G02F 1/3528; G02F 1/365; G03F 7/70316; G03F 7/70041; G03F 7/70575; G03F 7/70616; G02B 6/02328; Y02P 40/57
  See application file for complete search history.

(56) References Cited

U.S. PATENT DOCUMENTS

| | | | |
|---|---|---|---|
| 6,961,116 B2 | 11/2005 | Den Boef et al. | |
| 7,265,364 B2 | 9/2007 | Teunissen et al. | |
| 7,346,250 B1 | 3/2008 | Dabich, II et al. | |
| 7,532,798 B2* | 5/2009 | Williams | C03B 37/0124 385/125 |
| 7,646,471 B2 | 1/2010 | Teunissen et al. | |
| 8,306,379 B2* | 11/2012 | Benabid | C03B 37/02781 385/125 |
| 11,034,607 B2* | 6/2021 | Fokoua | C03B 37/0122 |
| 2003/0150242 A1 | 8/2003 | Caplen et al. | |
| 2007/0002336 A1 | 1/2007 | Pellemans et al. | |
| 2007/0013921 A1 | 1/2007 | Pellemans et al. | |
| 2007/0296960 A1 | 12/2007 | Den Boef et al. | |
| 2008/0198380 A1 | 8/2008 | Straaijer | |
| 2009/0168062 A1 | 7/2009 | Straaijer | |
| 2009/0195768 A1 | 8/2009 | Bijnen et al. | |
| 2010/0007863 A1 | 1/2010 | Jordanoska | |
| 2010/0233600 A1 | 9/2010 | Den Boef et al. | |
| 2010/0328655 A1 | 12/2010 | Den Boef | |
| 2010/0328658 A1* | 12/2010 | Benabid | G02B 6/02328 156/60 |
| 2011/0026032 A1 | 2/2011 | Den Boef et al. | |
| 2011/0032500 A1 | 2/2011 | Straaijer | |
| 2011/0102753 A1 | 5/2011 | Ven De Kerkhof et al. | |
| 2011/0102793 A1 | 5/2011 | Straaijer | |
| 2011/0188020 A1 | 8/2011 | Den Boef | |
| 2011/0249244 A1 | 10/2011 | Leewis et al. | |
| 2011/0310393 A1* | 12/2011 | Smirnov | G01N 21/4738 356/446 |
| 2012/0044470 A1 | 2/2012 | Smilde et al. | |
| 2012/0044495 A1 | 2/2012 | Straaijer | |
| 2013/0162996 A1 | 6/2013 | Straaijer et al. | |
| 2013/0308142 A1 | 11/2013 | Straaijer | |
| 2015/0261097 A1 | 9/2015 | Mathijssen et al. | |
| 2016/0002089 A1* | 1/2016 | Matsuo | G02B 6/02347 65/393 |
| 2016/0161863 A1 | 6/2016 | Den Boef et al. | |
| 2016/0370717 A1 | 12/2016 | Den Boef et al. | |

FOREIGN PATENT DOCUMENTS

| | | |
|---|---|---|
| DE | 102007033086 | 1/2009 |
| EP | 1455235 | 9/2004 |
| EP | 1628164 | 2/2006 |
| EP | 1739493 | 1/2007 |
| EP | 3450409 | 3/2019 |
| JP | 2000/143272 | 5/2000 |
| JP | 2007010666 | 1/2007 |
| JP | 2010523456 | 7/2010 |
| JP | 2010541011 | 12/2010 |
| WO | 2008083686 | 7/2008 |
| WO | 2009010317 | 1/2009 |
| WO | 2009044100 | 4/2009 |
| WO | 2011012624 | 2/2011 |
| WO | 2016102127 | 6/2016 |
| WO | 2017032454 | 3/2017 |
| WO | 2018127266 | 7/2018 |

OTHER PUBLICATIONS

Chinese Office Action issued in corresponding Chinese Patent Application No. 201980070004.8, dated Jun. 22, 2022.
International Search Report and Written Opinion issued in corresponding PCT Patent Application No. PCT/EP2019/076832, dated Dec. 13, 2019.
Wang, Y.Y. et al.: "Core-Surround Shaping of Hollow-Core Photonic Crystal Fiber Via HF Etching", IEEE Photonics Technology Letters, vol. 20, No. 12, pp. 1018-1020 (Jun. 15, 2008).
Gao, X. et al.: "Effect of subsurface impurities of fused silica on laser-induced damage probability", Optical Engineering, 53(2) (Feb. 2014).
Pfiffer, M. et al.: "Effects of deep wet etching in HF/HNO3 and KOH solutions on the laser damage resistance and surface quality of fused silica optics at 351nm", Optics Express, vol. 25, No. 5, pp. 4607-4620 (2017).
Kiyama, S. et al.: "Examination of Etching Agent and Etching Mechanism on Femtosecond Laser Microfabrication of Channels Inside Vitreous Silica Substrates", J. Phys. Chem. C, vol. 113, No. 27, pp. 11560-11566 (2009).
Schreiber, A. et al.: "Radiation Resistance of Quartz Glass for VUV Discharge Lamps", J. Phys. D: Appl. Phys, vol. 38, p. 3242 (2005).
Field, E. et al.: "The Impact of Different Cleaning Processes on the Laser Damage Threshold of Antireflection Coatings for Z-Backlighter Optics at Sandia National Laboratories", Optical Engineering, 53(12), 122516 (2014).
Da Costa Fernandes, B. et al.: "Understanding the Effect of Wet Etching on Damage Resistance of Surface Scratches", Scientific Reports, 8:1337 (2018).
Spierings, G.A.C.M,: "Wet Chemical Etching of Silicate Glasses in Hydrofluoric Acid Based Solutions", Journal of Materials Science, vol. 28 (1993).
Kosolapov et al., "Hollow-core revolver fibre with a double-capillary reflective cladding", Quantum Electronics, vol. 46, No. 3 (2016).
European Search Report issued in corresponding European U.S. Appl. No. 18204375, dated Apr. 12, 2019.
Office Action issued in corresponding Korean Patent Application No. 10 2021 7013008, dated Apr. 25, 2023.
Japanese Office Action issued in corresponding Japanese Patent Application No. 2021-520974, dated Apr. 22, 2022.
Communication issued in corresponding European Patent Application No. 19779907.5, dated Jan. 26, 2024.

* cited by examiner

OPTICAL FIBERS AND PRODUCTION METHODS THEREFOR

CROSS-REFERENCE TO RELATED APPLICATIONS

This application is the U.S. national phase entry of PCT Patent Application No. PCT/EP2019/076832 which was filed on Oct. 3, 2019, which claims the benefit of priority of European Patent Aapplication No. 18202368.9 which was filed on Oct. 24, 2018, and of European Patent Application No. 18204375.2 which was filed on Nov. 5, 2018, each of which is incorporated herein in its entirety by reference.

FIELD

The present invention relates to optical fibers, manufacturing intermediates for forming optical fibers, and methods for forming optical fibers. In particular, the invention may relate to optical fibers which have at least one aperture extending therethrough (the at least one aperture may form a hollow core or part of the cladding of the optical fiber). In particular, the present invention relates to hollow-core photonic crystal optical fibers having one or more rings of anti-resonant elements (also referred to as a hollow-core anti-resonant-reflecting fiber), and production methods therefor. Optical fibers formed according to the present invention may be used in metrology apparatus, for example in lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In the field of lithography, many measurement systems may be used both within a lithographic apparatus and external to a lithographic apparatus. Generally, such a measurement system may use a radiation source to irradiate a target with radiation and a detection system operable to measure at least one property of a portion of the incident radiation that scatters from the target. An example of a measurement system that is external to a lithographic apparatus is an inspection apparatus (also referred to as a metrology apparatus), which may be used to determine properties of a pattern previously projected onto a substrate by the lithographic apparatus. Such an external inspection apparatus may, for example, comprise a scatterometer. Examples of measurement systems that may be provided within a lithographic apparatus include: a topography measurement system (also known as a level sensor); a position measurement system (for example an interferometric device) for determining a position of a reticle or wafer stage; and an alignment sensor for determining a position of an alignment mark. These measurement devices may use electromagnetic radiation to perform the measurement. Such measurement systems may also use optical fibers, for example, for the delivery of the electromagnetic radiation or the generation of the electromagnetic radiation. It may be desirable to provide alternative methods for producing optical fibers (and optical fibers produced by such methods). It may be desirable that such alternative methods and optical fibers at least partially address one or more problems associated with prior art arrangements, whether identified herein or otherwise.

SUMMARY

According to a first aspect of the invention there is provided a method for forming an optical fiber, wherein the method comprises: providing a manufacturing intermediate having an elongate body and comprising an outer tube and a plurality of inner tubes, the plurality of inner tubes being arranged in the outer tube, the plurality of inner tubes being arranged in one or more ring structures around, and at least partially defining, an aperture extending through the elongate body along an axial dimension of the elongate body, a boundary of the aperture defining an internal surface of the manufacturing intermediate; etching the internal surface of the manufacturing intermediate using an etching substance; and drawing the manufacturing intermediate along the axial dimension so as to form the optical fiber, the optical fiber being a hollow-core anti-resonant-reflecting fiber comprising a plurality of anti-resonant elements formed from the inner tubes.

The method according to the first aspect of the invention relates to the fabrication of an optical fiber having a body with an aperture extending through the body. Advantageously, etching the internal surface of the manufacturing intermediate using an etching substance acts to remove contaminants from the internal surface of the manufacturing intermediate, increasing the quality and smoothness of the internal surface. In turn, this reduces absorption and/or scattering of radiation that, in use, propagates along the optical fiber. In turn, this reduces the amount of damage to the fiber that can be caused by such absorption and/or scattering of radiation. Etching the internal surface of the manufacturing intermediate further acts to reduce the stress present in the surface of the material, which may have been caused by previous treatments of the surface (e.g. during the fabrication steps of the manufacturing intermediate). Removing the top portion of a surface affected by stresses results in a surface with properties more closely resembling the properties of the bulk material, further increasing the damage threshold of the resulting fiber and may also results in better mechanical performance, e.g. by removing microcracks.

It will be appreciated that an elongate body is a body which is longer on one dimension than in the other two dimensions. It will be further appreciated that as used herein the dimension in which the elongate body is longest may be referred to as the axial dimension of the body. Similarly, a dimension of the elongate body perpendicular to the axial dimension may be referred to as a radial dimension.

The aperture of the manufacturing intermediate may be referred to as a hollow core and, once the manufacturing intermediate has been drawn to form the optical fiber, this will provide the hollow core of the fiber. The inner tubes surrounding the hollow core may be considered to provide a cladding portion. The cladding portion comprises a plurality of inner tubes, which, once the manufacturing intermediate has been drawn to form an optical fiber, will provide anti-resonance elements for guiding radiation through the hollow core of said optical fiber. The outer tube may be referred to as a support portion surrounding and supporting the cladding portion.

It will be appreciated that the smoothness of an etched surface is dependent on the etching depth (in turn, this may be dependent on the etching method, including a type and concentration of etching substance and a duration of the etching process). An advantage of performing the etching step on the manufacturing intermediate is that a radial dimension of the manufacturing intermediate is larger than a radial dimension of the fiber itself. Therefore, it is possible to etch the internal surface of the manufacturing intermediate to a greater depth than an optical fiber formed from such a manufacturing intermediate could be etched, resulting in a smoother surface and/or reaching a depth in which the concentration of chemical contaminants is relatively small.

Another advantage of first etching the internal surface of the manufacturing intermediate using an etching substance and then, subsequently, drawing the manufacturing intermediate to form the optical fiber is that any remaining contaminations (both chemical and physical) on the internal surface are extended during the drawing step of the process, therefore further increasing the quality of the surface of the aperture of the optical fiber.

Another advantage of performing the etching step on the manufacturing intermediate is that the axial dimension of the manufacturing intermediate is smaller than that of the optical fiber. As a result, an etching substance may more easily and/or evenly brought into contact with the internal surface of the manufacturing intermediate than with the internal surface of the fiber. This provides an easier etching process with improved control over the process due to the smaller scale of the etching area.

A manufacturing intermediate is an intermediate form obtained during the process of producing the fiber. The manufacturing intermediate may be formed from a preform of a fiber, and may be drawn into a fiber. The manufacturing intermediate may be referred to as a cane.

The aperture along an axial dimension of the manufacturing intermediate may be considered to provide a hollow core of the optical fiber (and may, for example, be located substantially in a central portion of the elongate body). Alternatively, the aperture along an axial dimension of the manufacturing intermediate may be located in an outer portion of the elongate body and may be considered to provide a structure within a cladding portion of the optical fiber.

Etching may remove chemical and physical contaminants from the internal surface of the manufacturing intermediate (and, in turn, from the resultant optical fiber). Example physical impurities include scratches, defects, and microcracks. Example chemical contaminants include impurities, dirt and organic materials, fingerprints, oils or the like. Removing chemical and physical contaminants such as impurities or scratches from the surface may reveal further chemical and/or physical contaminants underneath the surface. Examples include new chemical contaminants lying below the surface or deep cracks and scratches. Further etching may remove such chemical and/or physical impurities as well.

Another advantage of performing the etching step on the manufacturing intermediate is that smaller walls of the anti-resonance elements of the resultant optical fiber can be achieved. In turn, this improves the guidance of the resultant optical fiber.

The plurality of inner tubes may be arranged in a single ring structure around the hollow core so that each of the inner tubes is not in contact with any of the other inner tubes. The method of manufacturing an optical fiber according to the first aspect of the invention is particularly beneficial for such an arrangement comprising a plurality of inner tubes (which, in use, will form anti-resonance elements) arranged so that each inner tube is not in contact with any of the other inner tubes. This is because the walls that will form the anti-resonance elements do not contact those of adjacent anti-resonance elements and therefore the walls can be uniformly etched by the etchant. In contrast, a photonic-crystal fiber geometry wherein adjacent anti-resonance elements are in contact will have regions of increased thickness (which may be referred to as nodes) where the walls of the anti-resonance elements contact each other and, furthermore, such nodes will, in general, etch differently to the wall portions connecting them. In an extreme example, a Kagome fiber is provided with a web of interconnected walls, which extend between nodes. When such an arrangement is etched, even if the wall portions are etched uniformly, due to the presence of the nodes, an internal shape of the apertures being etched will be distorted. This distortion will degrade the guidance of radiation within the hollow-core of an optical fiber formed from the manufacturing intermediate. Furthermore, an extent of this distortion will increase with the depth of the etching. In contrast, an arrangement wherein the anti-resonance elements are arranged so that each anti-resonance element is not in contact with any of the other anti-resonant elements will not suffer from such distortion. As a result, a deeper etching depth can be achieved for such embodiments without negatively impacting the optical properties of the resultant optical fiber (in particular without negatively impacting the optical confinement or guidance of radiation through the optical fiber). As already discussed, an increased depth of etch will also improve the optical properties of the resultant optical fiber. Therefore there may be considered to be a synergy between (i) there being an arrangement wherein the anti-resonance elements are arranged so that each anti-resonance element is not in contact with any of the other anti-resonant elements; and (ii) first etching the internal surface of the manufacturing intermediate using an etching substance and then, subsequently, drawing the manufacturing intermediate to form the optical fiber. Such an arrangement is particularly advantageous.

By drawing the manufacturing intermediate along an axial dimension, the dimensions of the manufacturing intermediate perpendicular to the axial dimension may be reduced by a factor of at least 10. In some embodiments, the dimensions of the manufacturing intermediate perpendicular to the axial dimension may be reduced by a factor of at least 20. In some embodiments, the dimensions of the manufacturing intermediate perpendicular to the axial dimension may be reduced by a factor of at least 50.

As the manufacturing intermediate is drawn along an axial dimension and its length along the axial direction increases, the thicknesses of the walls of the elongate body will decrease. When the drawing process results in a normal or simple scaling, all of the dimensions that are perpendicular to the axial dimension are reduced by the same factor. If the dimensions perpendicular to the axial dimension are reduced by a factor f then the axial dimension will increase by a factor of $f^2$ (since material is conserved). Therefore, the thicknesses of the walls of the elongate body are greater than those of the optical fiber by a factor of f. In turn, advantageously, etching the manufacturing intermediate first and then drawing it to form the optical fiber allows the etching process to etch to a depth that is a factor f greater that the optical fiber would have to be etched by in order to obtain an optical fiber of comparable quality (if you chose to draw first and then etch).

In some embodiments, the etching may comprise a deep etching process.

It will be appreciated by the skilled person that the optimum depth of etching for which one may observe improved characteristics of the resultant optical fiber may vary from one manufacturing intermediate to another and will, in general, depend on several factors. Such factors include, for example, any of the following: the type and degree of purity of the of the material (for example glass) from which the elongate body is formed (this may define a distribution of the contaminants as a function of depth); a surface roughness of the initial glass tubes from which the manufacturing intermediate or parts of it are formed; and/or the method of the handling and fabrication of the manufacturing intermediate. On the one hand, it may be desirable to etch to a greater depth in order to remove more contaminants. On the other hand, the optimum etching depth may be limited by the mechanical stability of the etched parts. For example, it may be desirable to ensure that the etching is not so deep that the resultant manufacturing intermediate lacks sufficient mechanical stability to be drawn into an optical fiber.

It will be appreciated by the skilled person that the deep etching process is intended to mean an etching process wherein the etching depth is sufficiently deep that further removal of material causes no significant improvement in the characteristics of the resulting optical fiber from the manufacturing intermediate. In the case of chemical contaminations this may correspond to an optimum depth beyond which the concentration of the contaminants as a function of the depth reaches a plateau. In the case of the physical contaminant such as scratches and micro-cracks, this may correspond to an optimum depth beyond which the surface roughness reaches a plateau and/or further widening of the scratches does not result in further improvement of the optical properties of the resulting fiber, e.g. its optical damage threshold.

An advantage of etching the manufacturing intermediate instead of, for example, the fiber is that a deeper etch can be performed, as more material is available. The etching process is therefore able to remove contaminants more thoroughly, for example by etching away effects of a contaminant occurring in an area in the vicinity of the contaminant. Example defects that may be removed by a deep etching process include non-bridging oxygen hole centers (NBOHC), oxygen deficient centers (ODC), etc. present around surface defects.

The etching of the internal surface of the manufacturing intermediate may comprise a wet chemical etching process.

An advantage of using a wet chemical etch is the ability to control the etching process through control of the concentrations of a solution forming the etching substance. Another advantage may be the relative ease of control of liquid etching substances relative to gas etching substances. An advantage of using a wet etch for a manufacturing intermediate is that the dimensions of the manufacturing intermediate are sufficiently compact that it can be placed in a container comprising the etching substance for etching. Other advantages of using a wet chemical etch include that wet chemical etching uses simple equipment, e.g. a simple etching bath, can achieve a high etching rate, and provides high selectivity.

Etching of the internal surface of the manufacturing intermediate may comprise one of liquid submerging, capillary filling, pressurized filling, or spray etching. Such insertion methods are easier to apply to a manufacturing intermediate compared to a fiber, due to the comparatively short length and large diameter of the aperture in the manufacturing intermediate relative to the fiber.

The etching substance may, for example, comprise one of HF, a mixture of HF and $HNO_3$, or KOH. These substances are known to etch $SiO_2$, and are therefore useful to etch the internal surface of the manufacturing intermediate.

The method may be performed at room temperature. Not requiring an elevated temperature to perform the method makes the method easier and cheaper to perform.

Alternatively, the method may be performed in a controlled environment, for example under controlled temperature conditions, pressure conditions, and/or controlled gas compositions of the environment. This may provide increased control over the etching process.

The etching of the internal surface of the manufacturing intermediate may comprise a dry chemical etch.

The dry chemical etch may use a gaseous etching substance. For example, the etching substance may comprise hydrogen fluoride (HF) gas. Using an HF gas to perform the etch provides an alternative to wet etching, so that the method to be performed in instanced where a wet etch is not desirable. Other gases able to etch the material of the internal surface of the manufacturing intermediate may be used as well.

The method may further comprise cleaning the manufacturing intermediate so as to at least partially remove the etching substance and/or any products of the etching process from within the aperture.

It will be appreciated that the step of cleaning the manufacturing intermediate so as to at least partially remove the etching substance from within the aperture occurs after the etching step and may, for example, occur before the drawing step. The step of cleaning the manufacturing intermediate may comprise any of: flushing the aperture using a liquid;

drying the manufacturing intermediate in a vacuum chamber; and/or baking the manufacturing intermediate in an oven.

The method may further comprise etching an internal surface of one or more of the inner tubes of the manufacturing intermediate using the etching substance.

The method may further comprise blocking end portions of one or more of the inner tubes such that an internal surface of said inner tubes is not etched by the etching substance.

In such embodiments, only the surface which defines the hollow core of the manufacturing intermediate is etched. This selective etching of the hollow core of the manufacturing intermediate is beneficial because the capillary cavities defined by the inner tubes may be relatively small and, therefore, it may be difficult to control the etching process within said inner tubes with sufficient accuracy to ensure that the wall portions of the inner tubes have uniform thickness. In turn, uniform thickness of these wall portions may result in worse confinement of the guided radiation within the hollow cavity of an optical fiber drawn from the manufacturing intermediate.

Etching the internal surface of the manufacturing intermediate using an etching substance may comprise selectively etching the internal surface of some but not all of the plurality of apertures.

Alternatively, etching the internal surface of the manufacturing intermediate using an etching substance may comprise etching the internal surface of each one of the plurality of apertures.

The optical fiber is a hollow-core anti-resonant-reflecting fiber. For example the optical fiber may comprise any of the following: a single-ring hollow core fiber; or a nested-tubes hollow-core fiber.

The etching the internal surface of the manufacturing intermediate using an etching substance may comprise preferentially etching one or more portions of the internal surface of the manufacturing intermediate which correspond to one or more portions of the optical fiber that, in use, have dominant contact or interaction with light propagating through the optical fiber.

The method may further comprise etching an external surface of the manufacturing intermediate.

According to a second aspect of the invention there is provided an optical fiber formed according to the method of the first aspect of the invention.

The optical fiber may be a gas-filled fiber. The gas may be an atomic gas, a molecular gas, or a mixture of both.

It will be appreciated that an optical fiber according to the second aspect of the invention (as formed by the first aspect of the invention) can be distinguished over prior art optical fibers, as now discussed. For example, one way to distinguish an optical fiber according to the second aspect of the invention from a prior art optical fiber is to monitor side scattering of the radiation that propagates along the optical fibers. In a prior art optical fiber (from an unetched manufacturing intermediate), the surface roughness and scratches may manifest themselves as scattering points which scattered light as it propagates along the fiber. These scattering points will be visible to a suitable detector, or even the human eye if the wavelength of light is in the visible range. In contrast, an optical fiber according to the second aspect of the invention (i.e. drawn from an etched manufacturing intermediate) will have lower number of these scattering points. Therefore, by monitoring the amount of radiation scattered out of the optical fibers it is possible to distinguish an optical fiber according to the second aspect of the invention from a prior art optical fiber.

According to a third aspect of the invention there is provided a manufacturing intermediate for forming an optical fiber, the manufacturing intermediate being formed as an intermediate according to the method of the first aspect of the invention before the manufacturing intermediate is drawn along the axial dimension so as to form an optical fiber.

According to a fourth aspect of the invention there is provided a supercontinuum radiation source comprising: a radiation source operable to produce a radiation beam; and an optical fiber formed according to the method of the first aspect of the invention, wherein the optical fiber is configured to receive the radiation beam and to broaden a spectrum of that pulsed radiation beam so as to generate a supercontinuum radiation beam.

Radiation beam may be a pulsed radiation beam or a continuous wave radiation beam, for example a laser beam. The optical fiber may be a gas-filled fiber.

According to a fifth aspect of the invention there is provided a lithographic apparatus comprising an optical fiber formed according to the method of the first aspect of the invention.

According to a sixth aspect of the invention there is provided a metrology apparatus comprising an optical fiber formed according to the method of the first aspect of the invention.

Any of the above aspects of the invention may comprise one or more features of one or more of the other aspects of the invention as desired.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm). The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable minor array and a programmable LCD array.

Figure 1:
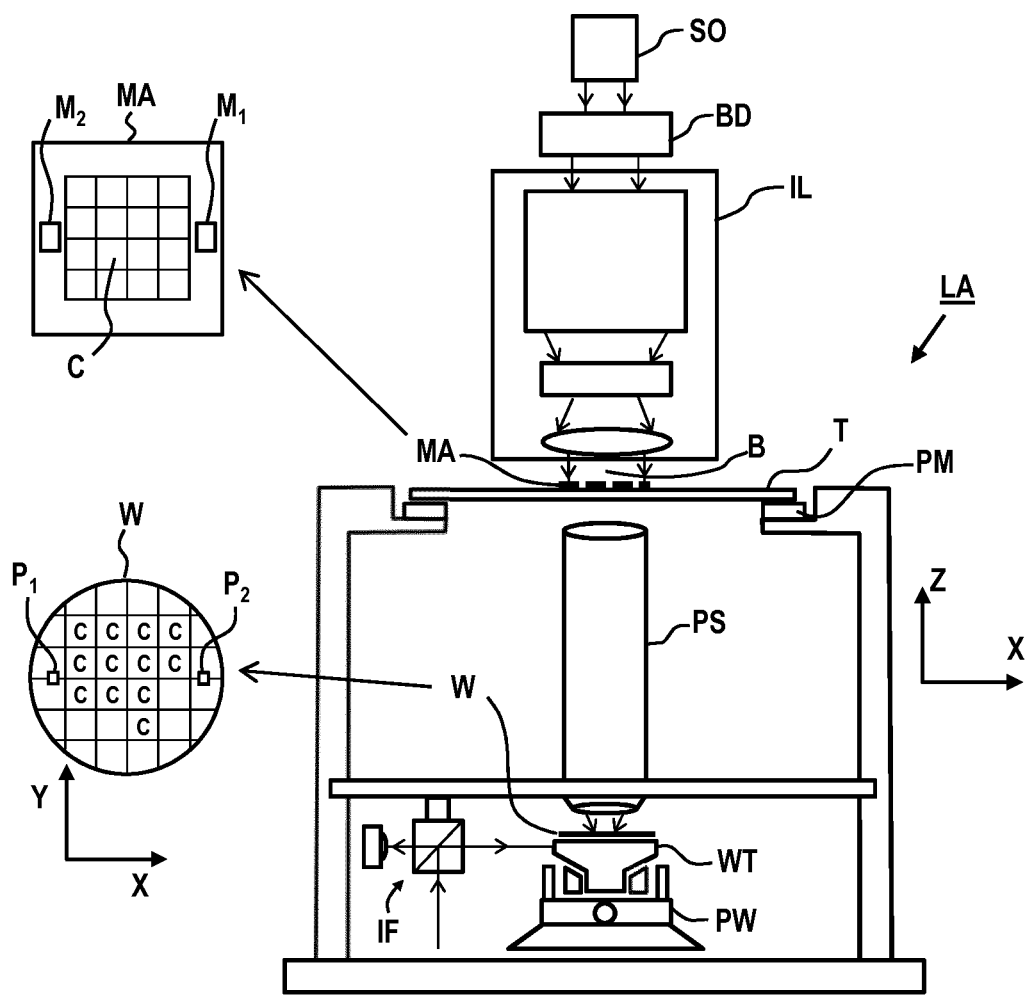
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
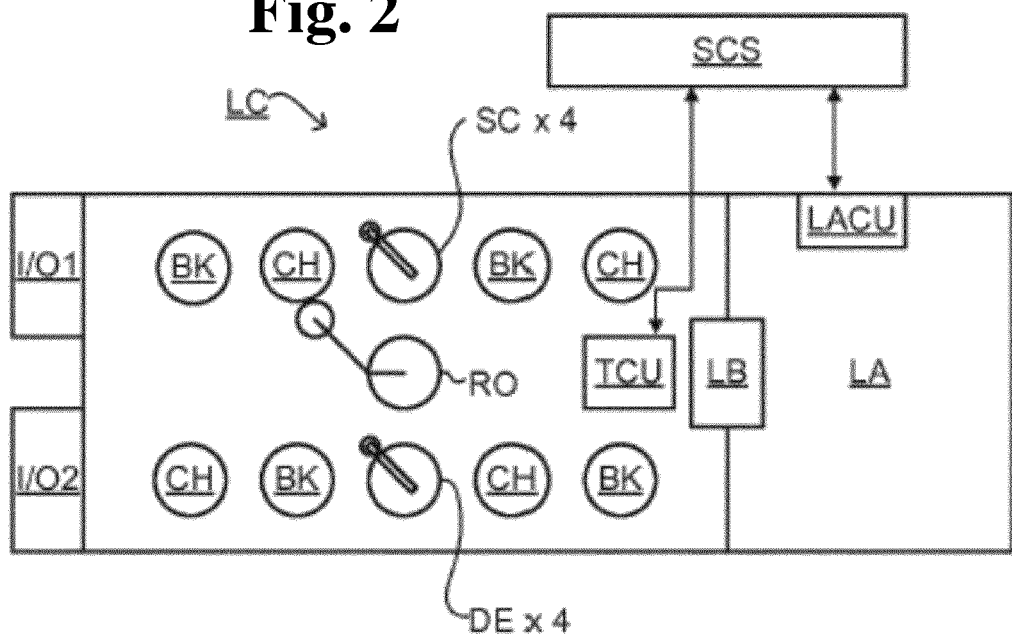
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
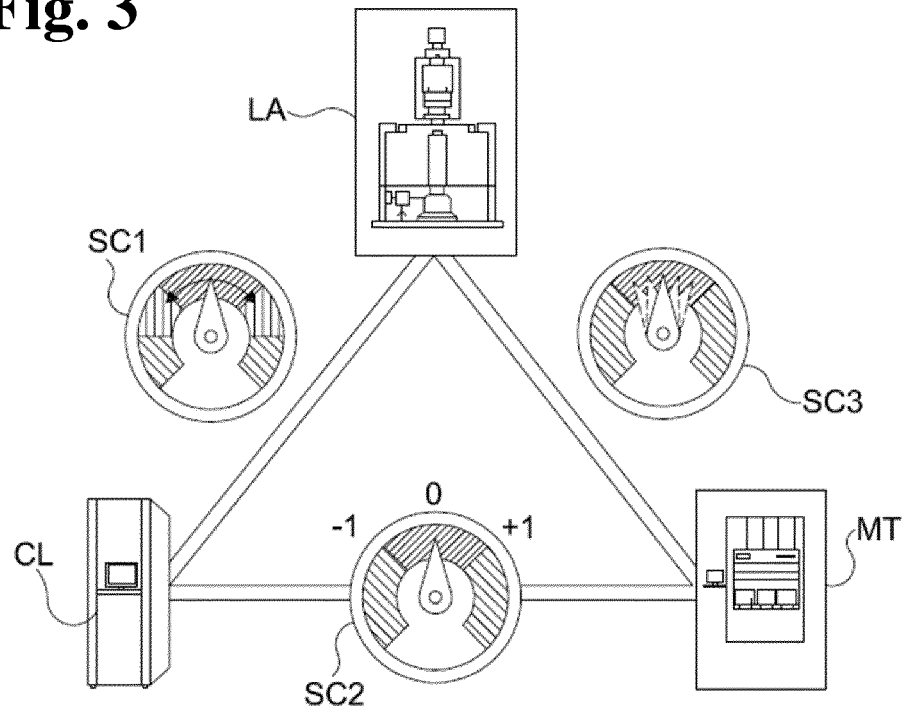
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred to as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032; or EP1,628,164A, incorporated herein by reference in their entirety. Aforementioned scatterometers may measure gratings using light from soft x-ray and visible to near-IR wavelength range.

Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings is strongly dependent on the measurement optics (in particular the NA of the optics) to be able to capture diffraction orders coming from the metrology targets. As indicated earlier, the diffracted signal may be used to determine shifts between two layers (also referred to as 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 4:
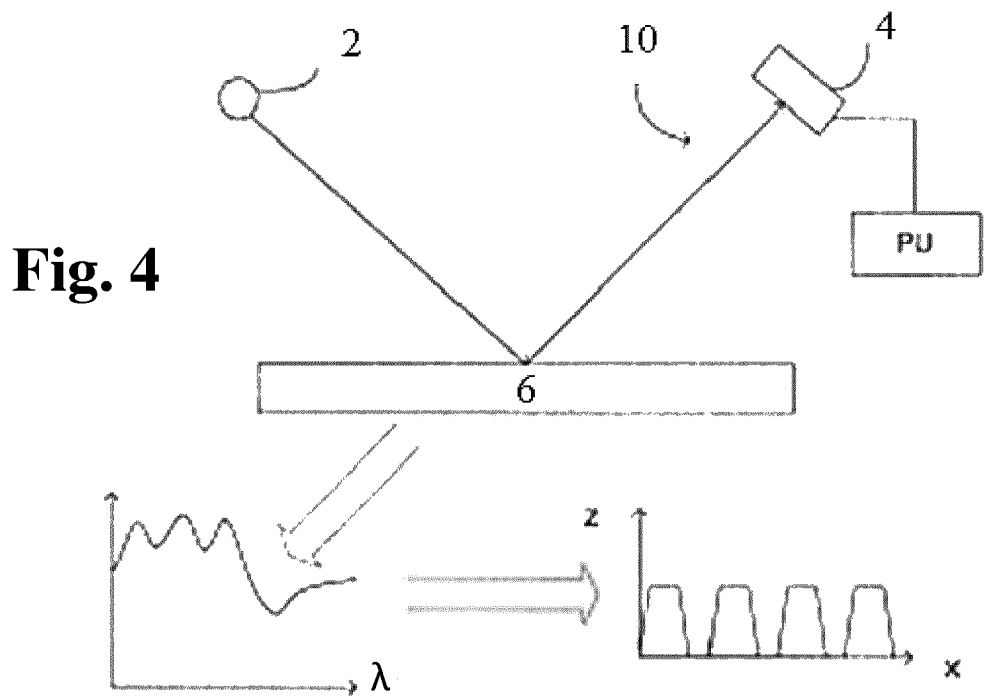
FIG. 4 depicts a schematic representation of a metrology apparatus.

A metrology apparatus, such as a scatterometer, is depicted in FIG. 4. The metrology apparatus comprises a broadband (white light) radiation projector 2 which projects radiation onto a substrate 6. The reflected or scattered radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focused position on the substrate. It will be understood that "height" in this context refers to a dimension broadly out of the plane to the substrate (also referred to as Z-axis, see FIG. 1). Typically, the level or height sensor performs measurements at a fixed location (relative to its own optical system) and a relative movement between the substrate and the optical system of the level or height sensor results in height measurements at locations across the substrate.

Figure 5:
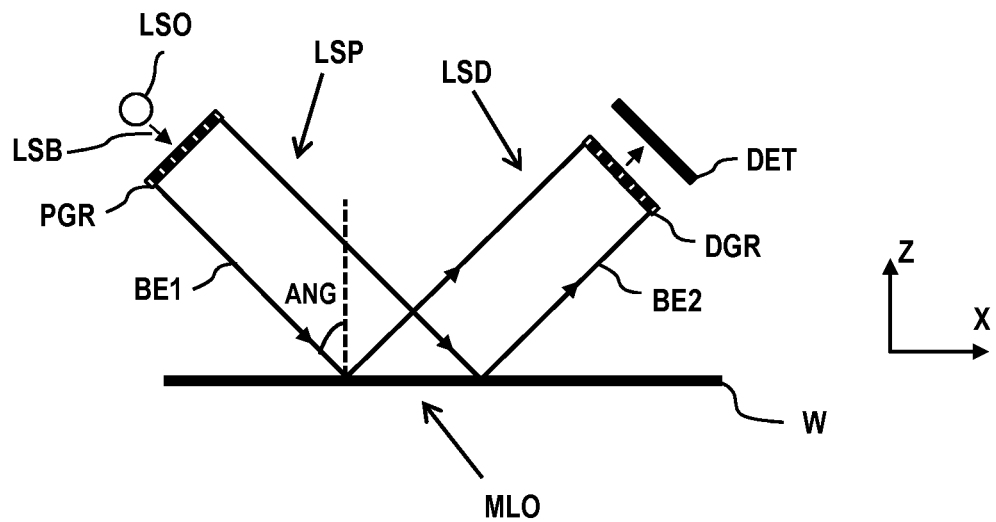
FIG. 5 depicts a schematic representation of a topography measurement system.

An example of a level or height sensor LS as known in the art is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is incident on a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs.

The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst other factors, on the design of the projection grating PGR and the (oblique) angle of incidence ANG. The projection unit LSP and/or the detection unit LSD may include further optical elements, such as lenses and/or mirrors, along the path of the patterned beam of radiation between the projection grating PGR and the detection grating DGR (not shown). In an embodiment, the detection grating DGR may be omitted, and the detector DET may be placed at the position where the detection grating DGR is located. Such a configuration provides a more direct detection of the image of the projection grating PGR. In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

The position measurement system may comprise any type of sensor that is suitable to determine a position of the substrate support WT. The position measurement system may comprise any type of sensor that is suitable to determine a position of the mask support T. The sensor may be an optical sensor such as an interferometer or an encoder. The position measurement system may comprise a combined system of an interferometer and an encoder. The sensor may be another type of sensor, such as a magnetic sensor, a capacitive sensor or an inductive sensor. The position measurement system may determine the position relative to a reference, for example the metrology frame or the projection system PS. The position measurement system may determine the position of the substrate table WT and/or the mask support T by measuring the position or by measuring a time derivative of the position, such as velocity or acceleration.

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference of light to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 6:
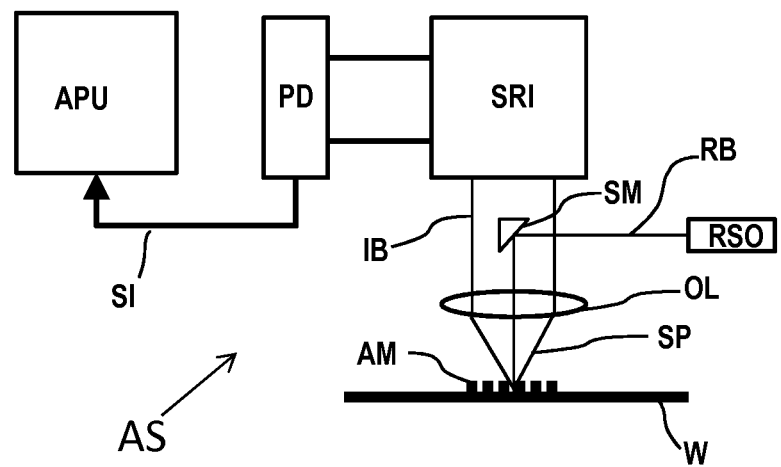
FIG. 6 depicts a schematic representation of an alignment sensor.

FIG. 6 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot minor SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios). Intensity signals SI are supplied to a processing unit APU. By a combination of optical processing in the block SRI and computational processing in the unit APU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM relative thereto. The substrate W is controlled in this movement by its mounting on a substrate support (e.g. a wafer table WT, see FIG. 1) and a substrate positioning system (e.g. a second positioner PW, see FIG. 1) controlling the movement of the substrate support. A substrate support position sensor (e.g. an interferometer, such as interferometer IF, see FIG. 1) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

The different types of apparatus described above use radiation originating from a radiation source. The radiation may be broadband radiation, e.g. white light radiation. Broadband radiation may be particularly useful in for example alignment mark measurement systems, level sensors, scatterometry tools, position measurement systems IF, inspections tools, or other sensors. The radiation source providing broadband radiation may be a supercontinuum source. A supercontinuum may be formed as a result of various non-linear optical effects that occur as high intensity radiation propagates through a suitable non-linear optical medium. The optical medium may be configured to guide the pump radiation. The pump radiation may be an electromagnetic wave. The optical medium in which the non-linear effects are achieved may be a fiber, for example a photonic crystal fiber, or may be a vessel filled with gas, for example a gas-filled hollow optical fiber. A fiber may provide a waveguiding effect, guiding the radiation in a controlled manner. In order to achieve non-linear effects, high intensity pump radiation may be provided. A supercontinuum may be achieved in a fiber where radiation, for example radiation from a pump source, is confined to a core area of the fiber. Photonic crystal fibers in particular, are suitable for strong confinement of radiation inside the fiber and, as a result, may be used to achieve high radiation intensity in a localized manner.

As radiation propagates along a fiber some of the radiation can be absorbed and/or scattered by the material from which the fiber is formed. This can damage the fiber, and the greater the amount of energy absorbed and/or scattered (which, in turn, is dependent on the intensity of the radiation), the greater the chance of damage occurring. Generally, a fiber will be able to support radiation, provided that the intensity of the radiation (i.e. the power per unit area) is below a threshold value for that fiber, and/or if the spectral content of the light does not fall in a region where the material of the fiber suffers from radiation-induced damage. For example, exposure of glass to ultraviolet radiation may cause optical damage and solarization of the glass due to high energy photons (short wavelength radiation). If radiation with an intensity above the threshold, and/or a wavelength short enough to damage the material of the fiber, is coupled to the fiber, the fiber may be damaged as a result. The damage threshold of a fiber may be determined by properties of the fiber such as, for example, the materials of the fiber and/or the quality of the fiber. The quality of the fiber material and fabrication is of particular importance in the areas of the fiber in which light is predominantly confined or guided. This is because the amount of radiation absorbed and/or scattered is dependent on the quality of the fiber in these areas. In fibers that achieve a strong confinement of light to a small area (which will increase the intensity of the radiation and/or overlap of the radiation with the fiber material), increasing the damage threshold may be of particular importance to improve the performance and lifetime of the fiber. In an example configuration the fiber may be a photonic crystal fiber with a hollow core, or a plurality of hollow cores. One element that affects the quality and the damage threshold of a fiber is contaminants present in the fiber, and/or the roughness of the surfaces of immediate contact to the light. These may be physical contaminants (e.g. defects, scratches, surface roughness) and/or chemical contaminants (e.g. impurities, dirt, oil, fingerprints). Contaminants may appear at a higher concentration at or near the surface of a material. In a hollow core fiber, where light may be confined at or near internal surfaces of a fiber forming the boundaries of a hollow core, removal of these contaminants may be of particular importance to increase performance and lifetime.

Embodiments of the present invention relate to methods for forming optical fibers and optical fibers formed by such methods. These optical fibers may have particular application in guiding a high intensity radiation beam. For example, these optical fibers may form part of a supercontinuum radiation source. Some embodiments of the present invention may relate to such a supercontinuum radiation source. These supercontinuum radiation sources (which may output broadband radiation) may have particular application in measurement systems. For example, such a supercontinuum radiation source may form part of an inspection apparatus (also referred to as a metrology apparatus), which may be external to a lithographic apparatus, and which may be used to determine properties of a pattern projected onto a substrate by the lithographic apparatus. Such an external inspection apparatus may, for example, comprise a scatterometer. Additionally or alternatively, a supercontinuum radiation source may form part of a measurement system which may be provided within a lithographic apparatus. Such internal measurement systems may include any of the following: a topography measurement system (also known as a level sensor); a position measurement system (for example an interferometric device) for determining a position of a reticle or wafer stage; or an alignment sensor for determining a position of an alignment mark. Some embodiments of the present invention may relate to such a measurement systems.

An optical fiber with one or more apertures, such as for example a hollow core photonic crystal fiber, may be used as a waveguiding element for radiation, and may additionally or alternatively be used for radiation generation. The process of forming an optical fiber may comprise a number of steps and intermediate forms. A fiber may be formed from a manufacturing intermediate 212, which may subsequently be drawn to form a fiber.

Figure 7:
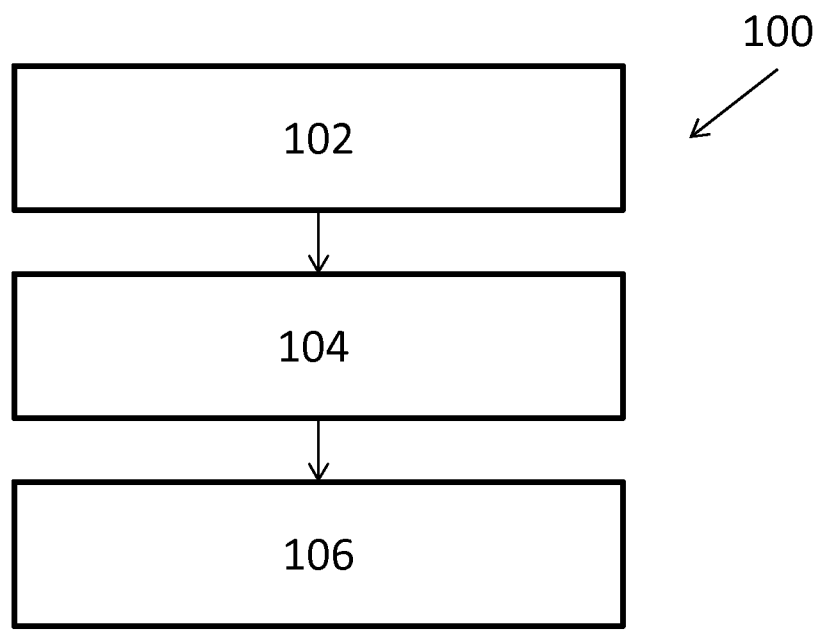
FIG. 7 depicts a flow diagram representing steps in a method of forming an optical fiber.

A method 100 according to a first embodiment of the invention relates to the fabrication of an optical fiber having a body with an aperture extending through the body, and is now described with reference to FIG. 7.

Figure 8:
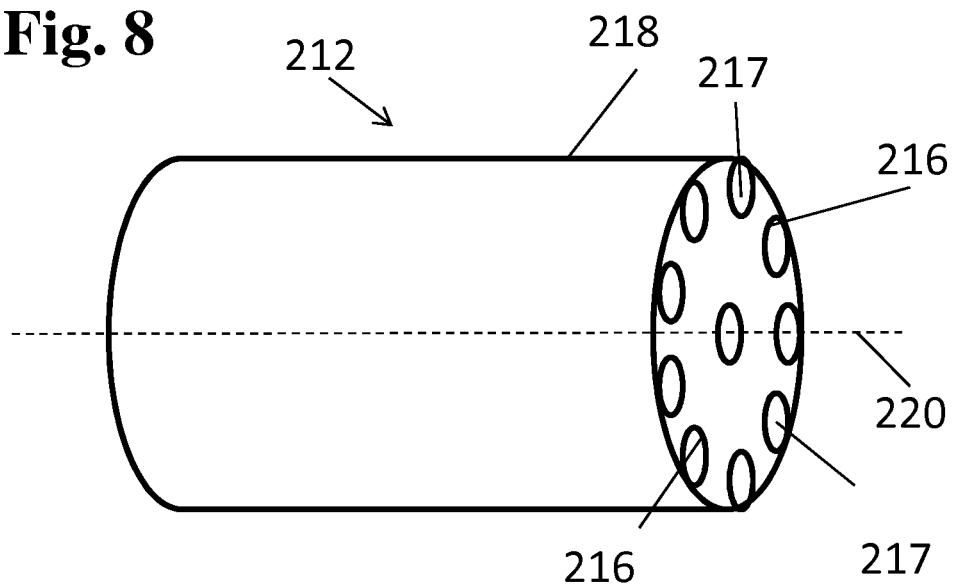
FIG. 8 depicts a schematic representation of a manufacturing intermediate.

Step 102 comprises providing a manufacturing intermediate. An example manufacturing intermediate 212 is shown in FIG. 8. The manufacturing intermediate 212 has an elongate body 218 and a plurality of apertures extending through the elongate body 218 along an axial dimension as defined by axis 220 of the elongate body 218. A boundary of each of the apertures 217 defines an internal surface 216 of the manufacturing intermediate 212.

Step 104 comprises etching at least a part of the internal surface of the manufacturing intermediate 212, e.g. etching the portion of the internal surface defined by at least one of the apertures 217. This may be done using an etching substance.

In step 106 an optical fiber is drawn by drawing the manufacturing intermediate 212 along the axial dimension of the elongate body 218.

An advantage of etching the internal surface 216 of the manufacturing intermediate 212 using an etching substance is that this has the effect of removing contaminants from the internal surface 216 of the manufacturing intermediate 212, increasing the quality and smoothness of the internal surface 216. In turn, this reduces absorption and/or scattering of radiation that, in use, propagates along the optical fiber. In turn, this increases the damage threshold of the fiber by decreasing the amount of damage caused by absorbed and/or scattered radiation. Etching the internal surface 216 of the manufacturing intermediate 212 further acts to reduce the stress present in the surface of the material of the manufacturing intermediate 212. This stress may have been caused by mechanical treatment of the surface, such as drilling or milling of the surface, or during drawing of a preform to form the manufacturing intermediate 212 (as discussed further below). Removing the stress-affected surfaces results in a surface with properties more closely resembling the properties of the bulk material. Increasing the resemblance of the internal surface 216 and the bulk material of the manufacturing intermediate 212 reduces damage done by radiation propagating through the fiber when in use, thereby increasing the damage threshold of the resulting fiber.

It will be appreciated that an elongate body 218 is a body which is longer in one dimension than in the other two dimensions of the body. It will be further appreciated that as used herein the dimension in which the elongate body 218 is the longest may be referred to as the axial dimension of the body. Similarly, a dimension of the elongate body 218 perpendicular to the axial dimension, and which passes through the axis 220, may be referred to as a radial dimension. Although this definition of axial and radial dimensions is set out here for a manufacturing intermediate 212, it will be appreciated that an analogous definition holds for objects from which the manufacturing intermediate 212 is formed (which may, for example, be referred to as a preform) and a fiber formed from a manufacturing intermediate 212.

It will be appreciated that the manufacturing intermediate 212, and an optical fiber formed from the manufacturing intermediate 212, may have some degree of flexibility and therefore the direction of the axis will not, in general, be uniform along the length of the manufacturing intermediate 212 or the optical fiber. The terms such as the optical axis, axial and radial dimensions, the transverse cross-section and the like will be understood to mean the local optical axis, the local axial and radial dimensions, the local transverse cross-section and so on. Furthermore, where components are described as being cylindrical or tubular these terms will be understood to encompass such shapes that may have been distorted as the component (for example manufacturing intermediate or optical fiber) is flexed.

A manufacturing intermediate 212 is an intermediate form obtained during the process of producing the fiber, a process described in more detail below. The manufacturing intermediate 212 may be formed from any material, typically a glass material. For example, the manufacturing intermediate 212 may consist of or comprise any of the following: high purity silica ($SiO_2$) (for example the F300 material as marketed by Heraeus Holding GmbH of Germany); soft glasses such as for example lead-silicate glass (for example the SF6 glass marketed by Schott AG of Germany); or other specialty glasses such as for example chalcogenide glass or heavy metal fluoride glasses (also referred to as ZBLAN glasses). It will be appreciated that the step 102 of providing a manufacturing intermediate 212 may comprise any or all of the steps or processes described below.

The manufacturing intermediate 212 may be formed from a preform 208 of a fiber, and may be drawn into a fiber. The manufacturing intermediate 212 may be referred to as a cane, which is a term of art. One of the apertures 217 along an axial dimension of the manufacturing intermediate 212 may be located substantially in a central portion of the elongate body 218. For such configurations, this aperture 217 may be considered to provide a core of the optical fiber. A core of a fiber may be defined as any part of the fiber that guides a predominant portion of the radiation power. Alternatively and/or additionally, one or more of the apertures 217 may be located in an outer portion of the elongate body surrounding the core, for example located so that these apertures 217 do not comprise the center of the manufacturing intermediate 212, or for example located closer to an outer surface of the manufacturing intermediate 212 than the center of the manufacturing intermediate 212. For such configurations, these apertures 217 may be considered to provide a structure within a cladding portion of the manufacturing intermediate 212 and the resulting optical fiber.

Steps in a method for forming a manufacturing intermediate 212 will now be described with reference to FIGS. 9 and 10.

Figure 9:
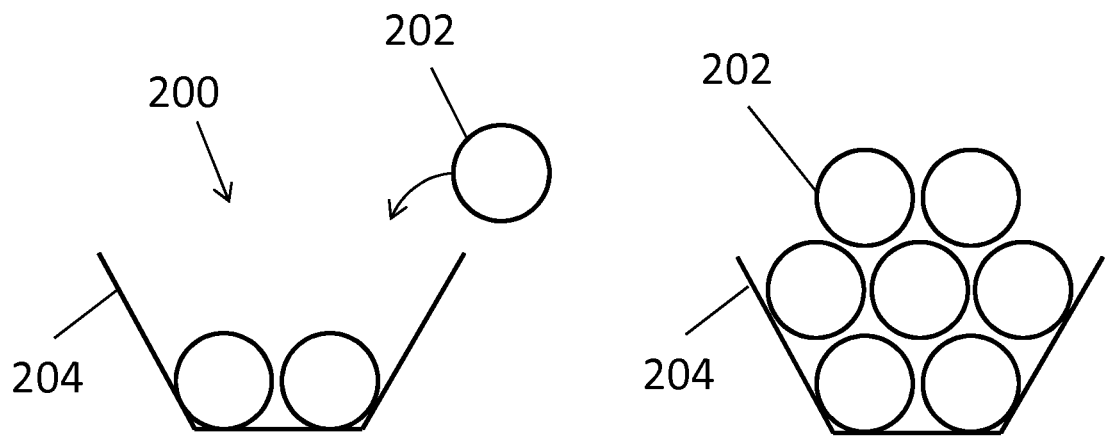
FIGS. 9(a), 9(b), and 9(c) depict schematic representations of steps in a process of forming an optical fiber related to forming a preform.
Figure 9:
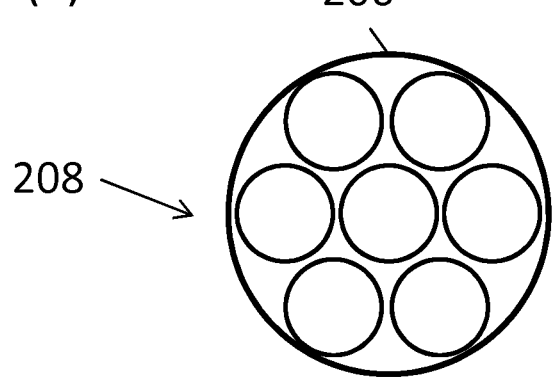
Figure 10:
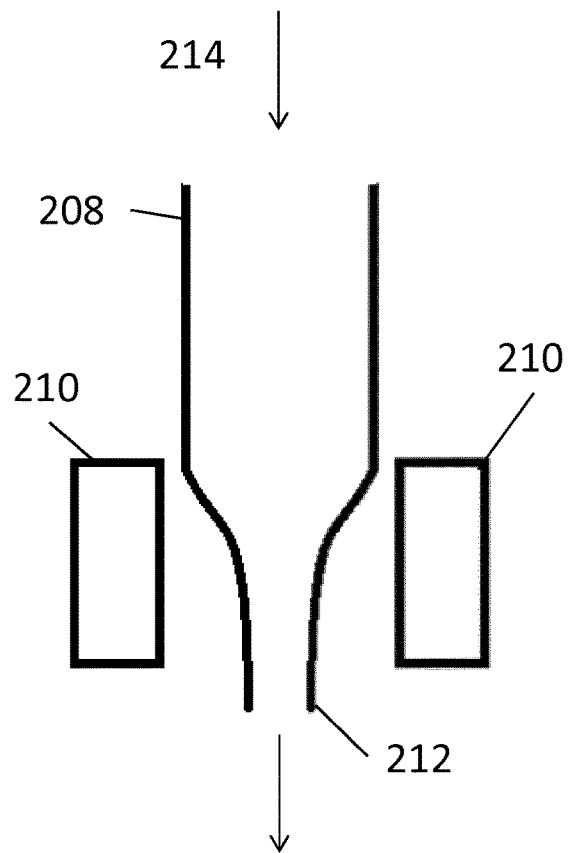
FIG. 10 depicts a schematic representation of forming a manufacturing intermediate from a preform of an optical fiber.

FIG. 9 depicts steps in a method of forming a preform 208 for forming a fiber with one or more apertures. In FIG. 9(a) preform stacking 200 is illustrated, wherein capillaries 202 are placed in a stacking base 204. The capillaries 202 may be silica ($SiO_2$) capillaries. A capillary 202 may be substantially cylindrical in shape with a substantially circular radial cross-section, and an elongate body in the axial dimension. The capillaries 202 may have a diameter substantially smaller than the length along an axis of the cylinder. In alternative embodiments, the capillaries 202 may have a substantially non-circular radial cross-section, for example an elliptical radial cross-section, a triangular radial cross-section, a square radial cross-section, or a hexagonal radial cross-section. A capillary 202 may be hollow, that is to say, it may be a tube, for example a silica tube, wherein the tube has a hollow center. The length of the capillaries 202 may be limited by the capacity of the hardware used for producing the capillary 202. The length of a capillary may be selected/chosen based on the required length of the resulting fiber. For example, the length of a capillary 202 may be of the order of one or more cm to several meters along the axis of the capillary 202. The diameter of a capillary 202 may be of the order of 1 mm. Capillaries 202 may be placed into a stacking base 204 manually. Manual preform stacking to create a desired configuration and distribution of capillaries 202 may be performed in a cleanroom environment. However, contaminants may be introduced during the preform stacking 200, for example in the form of damage to the capillaries and/or contamination of the preform with impurities. FIG. 9(b) shows a stacked capillary configuration in a stacking base 204. A stacking base may comprise a plurality of capillaries 202, wherein the capillaries may all have substantially the same radial cross-section, or alternatively, wherein the capillaries have a range of different shapes and/or sizes. From the stacking base 204, the capillaries 202 may be encapsulated by a jacket 206, as shown in FIG. 9(c). The jacket 206 may be a hollow cylinder formed from silica, surrounding the stacked capillaries and supporting the shape of their stacked configuration. The capillaries inside the jacket and the jacket form a preform 208. The preform 208 may have a diameter of the order of 1 cm to 10s of cm. The length of the preform may be of the order of 1 cm to several m.

Once the preform 208 is formed, it may be heated in a furnace to soften, but not melt, the material of the preform 208. In particular, the preform 208 is heated so as to make the material of the preform 208 sufficiently viscous that it is suitable for the subsequent drawing processes. It will be appreciated that the specific temperature to which a preform 208 is melted will, in general, depend on the material from which it is formed. The material of the preform may be glass, for example fused silica. An advantage of using silica as a material for the preform is the large optical transparency window of the material and its mechanical properties allowing good control over the fiber structure during the fiber fabrication process. The temperature of the furnace may, for example, be set in the range of 1850-2100 degrees Celsius, for the case of fused silica. The temperature to which the furnace is set is determined based on the properties of the material of the preform 208 to be softened. FIG. 10 shows a schematic depiction of a first drawing process 214 of the manufacturing process of a fiber. Preform 208 is drawn through furnace 210, to form a manufacturing intermediate 212. The length and diameter of the manufacturing intermediate will depend on the length and diameter of the preform, which in turn may depend on requirements of the fiber to be produced. The length of the manufacturing intermediate may be limited by the fabrication hardware specifications, for example the available diameters of a heating element in the furnace may limit the size of preform 208 or manufacturing intermediate 212 that can be accommodated. The manufacturing intermediate 212 may have a diameter of the order of 1 mm to 10 mm, for example a diameter in the range of 1 mm-2 mm. The length of the manufacturing intermediate 212 may be in the order of 1 m. The softening of the material may result in a fusing of the materials of the jacket 206 and/or the capillaries 202, and the resulting manufacturing intermediate 212 may therefore be considered to form a single unitary body comprising one or more apertures formed by the capillaries 202 of the preform 208.

Figure 11:
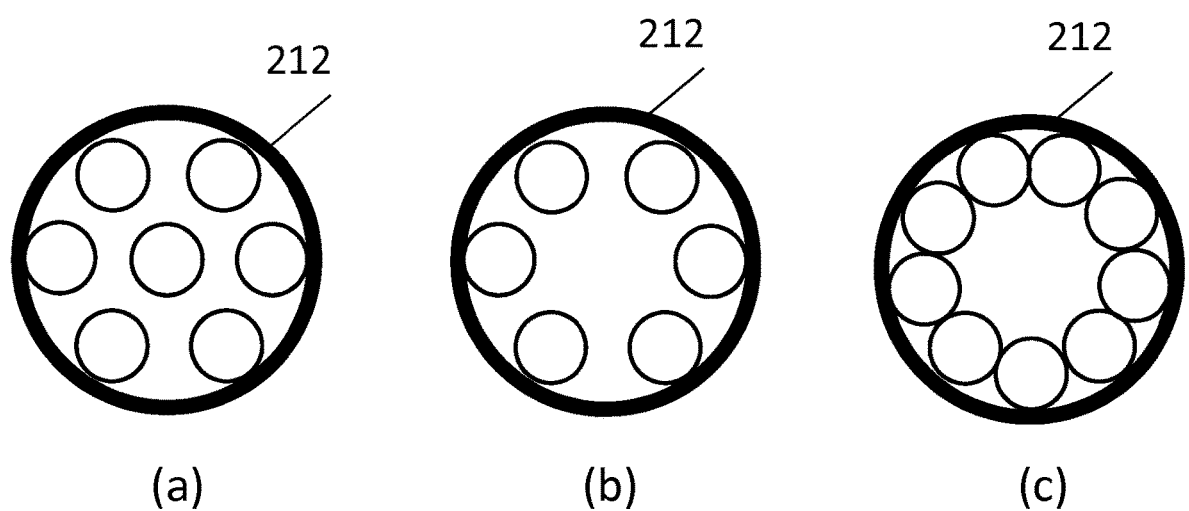
FIGS. 11(a), 11(b), and 11(c) depict a schematic representation of example configurations of a manufacturing intermediate.

The stacking of the capillaries inside the preform may be performed in a controlled manner. Capillary stacking may be performed by hand, may be automatized, or a combination of both. The placement of the capillaries 202, and the resulting placement of the apertures in the manufacturing intermediate 212 correspond to different hollow core designs. FIGS. 11(a), 11(b), and 11(c) illustrate example non-limiting designs of radial cross-sections of manufacturing intermediates 212 with a plurality of apertures. A manufacturing intermediate 212 may be drawn into an optical fiber with a corresponding distribution of apertures in a radial cross-section. The fiber drawing process may comprise inserting the manufacturing intermediate 212 into a glass, e.g. fused silica, tube, wherein the tube functions as a jacket, and drawing the jacket and manufacturing intermediate combination into a fiber. Alternatively the manufacturing intermediate 212 may be drawn directly into a fiber. A fiber may be formed by heating a manufacturing intermediate 212, which may be inserted into a jacket, in a furnace to soften the material and drawing the fiber from the softened material. The furnace may be located in a fiber drawing tower. One or more rollers may be used to extend and draw the fiber from the manufacturing intermediate 212. An optical fiber drawn from a manufacturing intermediate 212 may have an outer diameter below 1 mm. The outer diameter of a fiber may be of the order of 100 µm, and may fall in the range of 50 µm-500 µm, for example 150 µm. The length of the resulting fiber may be of the order of 10 m to 1000 m. Other lengths may also be obtained depending on the size and the conditions of the fiber drawing process.

Hollow-core photonic crystal fibers (HC-PCFs) are typically divided into two classes depending on the physical guidance mechanism: hollow-core photonic bandgap fibers (HC-PBFs) and hollow-core anti-resonant-reflecting fibers (HC-AFs). Preferred embodiments of the present invention the relate to the formation of hollow-core anti-resonant-reflecting fibers (HC-AFs).

Although three different example designs of manufacturing intermediates 212 are shown (in a transverse plane) in FIGS. 11(a), 11(b), and 11(c), in particularly preferred embodiments of the present invention the manufacturing intermediate 212 is generally of the form of that shown in FIG. 11(b). The general form of such a manufacturing intermediate 212 is now described with reference to FIG. 12, which is a schematic cross sectional view of a manufacturing intermediate 300 in a transverse plane.

The manufacturing intermediate 300 comprises an elongate body comprising an outer tube 308 and a plurality of inner tubes 304. The plurality of inner tubes 304 are arranged in the outer tube 308. In particular, the plurality of inner tubes 304 are arranged in one or more ring structures around, and at least partially defining, an aperture 302 extending through the elongate body along an axial dimension of the elongate body. A boundary of the aperture 302 defines an internal surface of the manufacturing intermediate 300.

Figure 12:
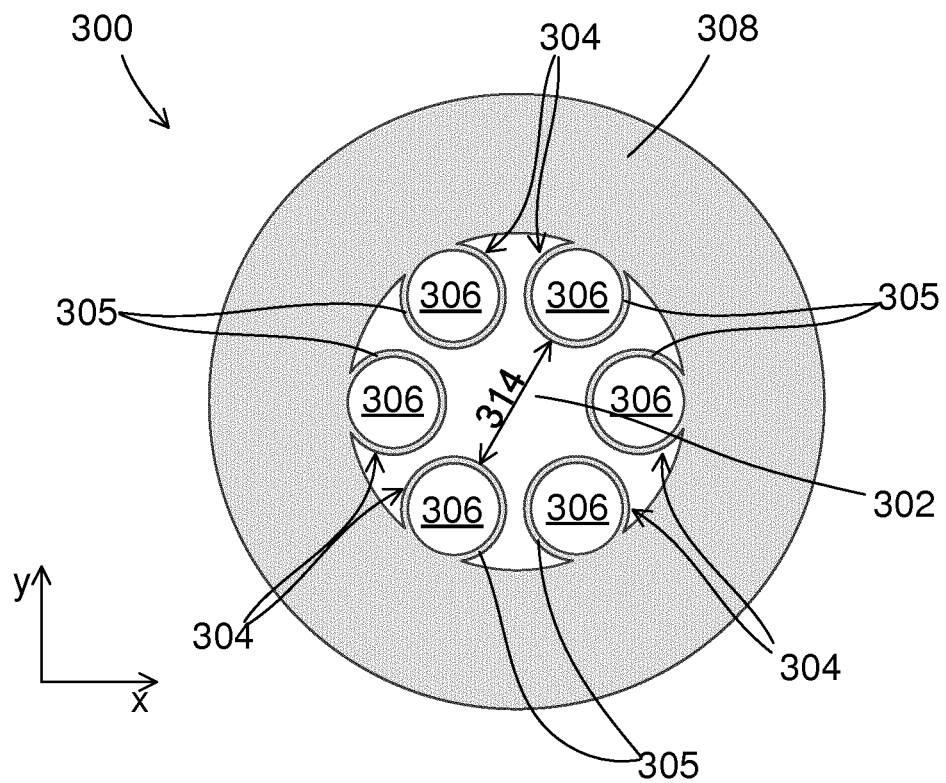
FIG. 12 is a schematic cross sectional view of a hollow core manufacturing intermediate in a transverse plane (i.e. perpendicular to an axis of the manufacturing intermediate)

The body of the manufacturing intermediate 300 is longer in one dimension compared to the other two dimensions of the manufacturing intermediate 300. This longer dimension may be referred to as an axial direction and may define an axis of the manufacturing intermediate 300. The two other dimensions define a plane which may be referred to as a transverse plane. FIG. 12 shows a cross-section of the manufacturing intermediate 300 in this transverse plane (i.e. perpendicular to the axis), which is labelled as the x-y plane. The transverse cross-section of the manufacturing intermediate 300 may be substantially constant along the fiber axis.

It will be appreciated that the manufacturing intermediate 300 may have some degree of flexibility and therefore the direction of the axis will not, in general, be uniform along the length of the manufacturing intermediate 300. The terms such as the optical axis, the transverse cross-section and the like will be understood to mean the local optical axis, the local transverse cross-section and so on. Furthermore, where components are described as being cylindrical or tubular these terms will be understood to encompass such shapes that may have been distorted as the manufacturing intermediate 300 is flexed.

The manufacturing intermediate 300 may have any length and it will be appreciated that the length of the manufacturing intermediate 300 may be dependent on the application.

The aperture 302 of the manufacturing intermediate 300 may be referred to as a hollow core 302 (once the manufacturing intermediate 300 has been drawn to form an optical fiber this will provide the hollow core of the fiber). The outer tube 308 may be referred to as a support portion 308 surrounding and supporting the cladding portion. The inner tubes 304 surrounding the hollow core 302 may be considered to provide a cladding portion. The cladding portion comprises a plurality of inner tubes 304, which, once the manufacturing intermediate 300 has been drawn to form an optical fiber, will provide anti-resonance elements for guiding radiation through the hollow core 302 of said optical fiber. In particular, the plurality of anti-resonance elements are arranged to confine radiation that propagates through the manufacturing intermediate 300 predominantly inside the hollow core 302 and to guide the radiation along the manufacturing intermediate 300. The manufacturing intermediate 300 may be considered to comprise a body (comprising the cladding portion and the support portion 308) having a hollow core 302. The hollow core 302 of the manufacturing intermediate 300 may be disposed substantially in a central region of the manufacturing intermediate 300, so that the axis of the manufacturing intermediate 300 may also define an axis of the hollow core 302 of the manufacturing intermediate 300.

The cladding portion comprises a plurality of tubes 304, which, in the optical fiber formed from the manufacturing intermediate 300, provide anti-resonance elements for guiding radiation propagating through the optical fiber. In particular, in this embodiment, the cladding portion comprises a single ring of six inner tubes 304, which may be referred to as tubular capillaries 304.

The capillaries 304 may be circular in cross section, or may have another shape. Each capillary 304 comprises a generally cylindrical wall portion 305 that at least partially defines the hollow core 302 of the manufacturing intermediate 300 and separates the hollow core 302 from a capillary cavity 306. It will be appreciated that, in use (once the manufacturing intermediate 300 has been formed into an optical fiber) the wall portion 305 may act as an anti-reflecting Fabry-Perot resonator for radiation that propagates through the hollow core 302 (and which may be incident on the wall portion 305 at a grazing incidence angle). The thickness of the wall portion 305 may be suitable so as to ensure that reflection back into the hollow core 302 is generally enhanced whereas transmission into the capillary cavity 306 is generally suppressed. In some embodiments, the capillary wall portion 305 may have a thickness, once drawn to form the optical fiber, of between 0.01-10.0 µm.

It will be appreciated that, as used herein, the term cladding portion is intended to mean a portion of the manufacturing intermediate 300, which, in use (once the manufacturing intermediate has been drawn into an optical fiber), is for guiding radiation propagating through the optical fiber (i.e. the capillaries 304 which confine said radiation within the hollow core 302). The radiation may be confined in the form of transverse modes, propagating along the fiber axis.

The support portion 308 is generally tubular and supports the six capillaries 304 of the cladding portion. The six capillaries 304 are distributed evenly around an inner surface of the support portion 108. The six capillaries 304 may be described as being disposed in a generally hexagonal formation.

The capillaries 304 are arranged so that each capillary is not in contact with any of the other capillaries 304. Each of the capillaries 304 is in contact with the support portion 308 and spaced apart from adjacent capillaries 304 in the ring structure. Such an arrangement may be beneficial since it may increase a transmission bandwidth of the manufacturing intermediate 300 (relative, for example, to an arrangement wherein the capillaries are in contact with each other). Furthermore, as will be discussed further below, such an arrangement allows the manufacturing intermediate 300 to be etched to a greater depth while still maintaining the optical properties of the optical fiber formed from the manufacturing intermediate 300. Alternatively, in some embodiments, each of the capillaries 304 may be in contact with adjacent capillaries 304 in the ring structure.

The six capillaries 304 of the cladding portion are disposed in a ring structure around the hollow core 302. An inner surface of the ring structure of capillaries 304 at least partially defines the hollow core 302 of the manufacturing intermediate 300. The diameter of the hollow core 302 (which may be defined as the smallest dimension between opposed capillaries, indicated by arrow 314) may affect the mode field diameter, impact loss, dispersion, modal plurality, and non-linearity properties of an optical fiber formed from the hollow core manufacturing intermediate 300. The diameter of the hollow core 302, once drawn into an optical fiber, may be between 10 and 1000 µm.

In this embodiment, the cladding portion comprises a single ring arrangement of capillaries 304 (which, in use, will act as anti-resonance elements). Therefore, a line in any radial direction from a center of the hollow core 302 to an exterior of the manufacturing intermediate 300 passes through no more than one capillary 304.

It will be appreciated that other embodiments may be provided with different arrangements of anti-resonance elements. These may include arrangements having multiple rings of anti-resonance elements and arrangements having nested anti-resonance elements. Furthermore, although the embodiment shown in FIG. 12 comprises a ring of six capillaries, in other embodiments, one or more rings comprising any number of anti-resonance elements (for example 4, 5, 6, 7, 8, 9, 10, 11 or 12 capillaries) may be provided in the cladding portion. Optionally, the support portion 308 may comprise a deformable portion to at least partially isolate the cladding portion from external stresses. The anti-resonance elements may all have the same diameter or, alternatively, the anti-resonance elements may have different diameters. The geometry of the manufacturing intermediate 300 and optical fibers formed therefrom may be of the form of any of the geometries disclosed in WO2017/032454A1, the contents of which is incorporated herein by reference. In particular, the geometry of the manufacturing intermediate 300 and optical fibers formed therefrom may be of the any of the arrangements shown in FIGS. 1A-1E of WO2017/032454A1, and the alternatives thereto described in the accompanying description. In the above-described example shown in FIG. 12, the capillaries 304 are generally circular in cross-section (in a transverse plane). It will be appreciated that in alternative embodiments, the capillaries 304 may have a substantially non-circular cross-section (in the transverse plane), for example an elliptical cross-section, a triangular cross-section, a square cross-section, or a hexagonal cross-section.

It will be appreciated that the smoothness of an etched surface is dependent on the etching depth, which in turn may be dependent on the details of the etching method, e.g. a type, temperature, and concentration of an etching substance, and on a duration of the etching process. An advantage of performing the etching step 104 on the manufacturing intermediate 212 is that the radial dimension of the manufacturing intermediate 212 is larger than a radial dimension of the fiber to be drawn from the manufacturing intermediate 212. Therefore it is possible to etch the internal surfaces 216 of the manufacturing intermediate 212 to a greater depth than an optical fiber formed from such a manufacturing intermediate 212 could be etched, resulting in a smoother internal surface 216 (and in turn, a smoother internal surface of the resulting fiber).

Another advantage of first etching the internal surface 216 of the manufacturing intermediate 212 using an etching substance and then, subsequently, drawing the manufacturing intermediate 212 (i.e. step 106) to form the optical fiber is that any remaining chemical and physical contaminations on the internal surface 216 are extended during the drawing step of the process. Therefore, reducing the amount of contaminants before the drawing step, before the contaminants can be extended across the fiber, further increases the quality of the internal surface 216 of the aperture of the optical fiber.

Another advantage of performing the etching step on the manufacturing intermediate 212 is that the axial dimension 220 of the manufacturing intermediate 212 is smaller than the axial dimension of the optical fiber drawn from it. As a result, an etching substance may more easily and/or more evenly be brought into contact with the internal surface 216 of the manufacturing intermediate 212 than with an internal surface of the fiber itself. This provides an easier etching process with improved control over the process due to the smaller scale of the etching area.

Another advantage of performing the etching step on the manufacturing intermediate 212 is that the axial dimension 220 of the manufacturing intermediate 212 is smaller than the axial dimension of the optical fiber drawn from it. As a result, using one etched manufacturing intermediate one may obtain a longer length of fibers with improved properties thus increasing the yield when compared to etching the fiber itself.

Another advantage of performing the etching step on the manufacturing intermediate 212 is that smaller walls of the anti-resonance elements (for example smaller wall portions 305) can be achieved. In turn, this improves the guidance of the resultant optical fiber.

Furthermore, the above-described method of manufacturing an optical fiber (by first etching the internal surface of the manufacturing intermediate then drawing the manufacturing intermediate) is particularly beneficial for an arrangement comprising a plurality of inner tubes (which, in use, will form anti-resonance elements) arranged so that each inner tube is not in contact with any of the other inner tubes. An example of such a geometry is the manufacturing intermediate 300 shown in FIG. 12. This is because the walls (e.g. wall portions 305) that will form the anti-resonance elements do not contact those of adjacent anti-resonance elements and can be uniformly etched by the etchant. In contrast, a photonic-crystal fiber geometry wherein adjacent anti-resonance elements are in contact will have regions of increased thickness (which may be referred to as nodes) where the walls of the anti-resonance elements contact each other and, furthermore, such nodes will, in general, etch differently to the wall portions connecting them. In an extreme example, a Kagome fiber is provided with a web of interconnected walls, which extend between nodes. When such an arrangement is etched, even if the wall portions are etched uniformly, due to the presence of the nodes, an internal shape of the apertures being etched will be distorted. This distortion will degrade the guidance of radiation within the hollow-core of an optical fiber formed from the manufacturing intermediate. Furthermore, an extent of this distortion will increase with the depth of the etching. In contrast, an arrangement wherein the anti-resonance elements are arranged so that each anti-resonance element is not in contact with any of the other anti-resonant elements will not suffer from such distortion. As a result, a deeper etching depth can be achieved for such embodiments without negatively impacting the optical properties of the resultant optical fiber (in particular without negatively impacting the optical confinement or guidance of radiation through the optical fiber). As already discussed, an increased depth of etch will also improve the optical properties of the resultant optical fiber. Therefore there may be considered to be a synergy between (i) there being an arrangement wherein the anti-resonance elements are arranged so that each anti-resonance element is not in contact with any of the other anti-resonant elements; and (ii) first etching the internal surface of the manufacturing intermediate using an etching substance and then, subsequently, drawing the manufacturing intermediate. Such an arrangement is particularly advantageous.

Etching, using an etching substance, may remove chemical and physical contaminants from the internal surface 216 of the manufacturing intermediate 212. Contaminants may be present in a material and/or may be introduced during the manufacturing process of the manufacturing intermediate 212. Example physical contaminants include scratches, defects, and microcracks. Example chemical contaminants include impurities present in the material. Removing chemical contaminants such as impurities from a surface may reveal further physical contaminants at or near the surface, caused by the chemical contaminants. Further etching may remove these further physical contaminants.

The etching may comprise a deep etching process. As used herein, a deep etching process may be defined as any etching to a depth beyond which further removal of the material would cause no noticeable improvement in the characteristics of the resulting fiber from the manufacturing intermediate 212. In the case of chemical contaminations, deep may correspond to an etching depth beyond which the concentration of the contaminants as a function of the depth reaches a plateau/ceases to decrease. In the case of physical contaminants such as scratches and microcracks, deep may correspond to an etching depth beyond which the surface roughness reaches a plateau and/or further widening of scratches does not result in further improvement of the optical properties of the resulting fiber, e.g. its optical damage threshold. The optimal depth of etching for which improved characteristics of the resulting fiber may be observed may vary from one manufacturing intermediate 212 to another. The optimal depth may depend on several factors, including for example the type and/or degree of purity of the material forming the manufacturing intermediate 212 (e.g. fused silica), as this may affect for example the distribution of contaminants in the material as a function of depth. The optimal etching depth may further depend on the surface roughness of the initial materials (for example the preform 208, the capillaries 202 and the like), and/or the method of fabrication of the manufacturing intermediate. An optical etching depth value may be determined empirically, for example through trial and error. The etching depth may be limited by the dimensions of the manufacturing intermediate 212 and the mechanical stability of the etched parts, for example if the etching process etches too deep, the etched material may lack the mechanical stability to be drawn into a fiber.

Fibers produced from etched and unetched manufacturing intermediates 212 may have several distinguishing factors, for example scattering properties. An example method to distinguish between fibers formed from etched and unetched manufacturing intermediates 212 is to observe the amount of side scattering of electromagnetic radiation propagating along the fiber. In a fiber formed from an unetched manufacturing intermediate 212, the surface roughness and scratches present along the internal surface may manifest as scattering points, which may scatter the electromagnetic radiation as it propagates along the fiber. Such scattering points may be observed using a suitable detector. Scattering points may in some cases even be visible to the naked human eye, if the electromagnetic radiation comprises visible light. Compared to a fiber formed from an unetched manufacturing intermediate 212, fibers formed from an etched manufacturing intermediate 212 may have less of the radiation scattering points described above.

An advantage of etching the manufacturing intermediate 212 instead of, for example, the fiber drawn from it, is that a deeper etch can be performed, as the radial dimensions of the manufacturing intermediate 212 are larger than the radial dimensions of the fiber, so more material is available to etch. When drawing a manufacturing intermediate 212 along its axial dimension for forming the fiber, the axial dimension, which may also be referred to as the length of the manufacturing intermediate and/or fiber, is increased and the dimensions of the manufacturing intermediate 212 perpendicular to the axial dimension are decreased. When the drawing process results in a normal or simple scaling, all of the dimensions that are perpendicular to the axial dimension are reduced by the same factor. If the dimensions perpendicular to the axial dimension are reduced by a factor f then the axial dimension will increase by a factor of $f^2$ (since material is conserved). Therefore, the thicknesses of the walls of the elongate body of the manufacturing intermediate 212 are greater than those of the optical fiber by a factor of f. In turn, advantageously, etching the manufacturing intermediate 212 first and then drawing it to form the optical fiber allows the etching process to etch to a depth that is a factor f greater that the optical fiber would have to be etched by in order to obtain an optical fiber of comparable quality (if you chose to draw first and then etch). Therefore, etching the manufacturing intermediate 212, the possible etch depth may be of approximately a factor of f greater, compared to etching a drawn fiber. In some embodiments, in the process of drawing the manufacturing intermediate 212 to form the optical fiber, the dimensions perpendicular to the axial dimension are reduced by a factor of at least 10, for example by a factor of the order of 20 or a factor of the order of 50.

The etching process performed on the manufacturing intermediate 212 is able to etch deeper, and is therefore able to remove contaminants more thoroughly, for example by etching away effects of a contaminant occurring in the vicinity of the contaminant. Example defects that may be removed by a deep etching process include non-bridging oxygen hole centers (NBOHC), and/or oxygen deficient centers (ODC) present around surface defects.

The etching may comprise a wet chemical etching process. An advantage of using a wet chemical etching is the ability to control the etching process through control of the concentrations of a solution forming the etching substance. Another advantage may be the isotropic etching properties of a wet etching process. Another advantage may be the relative ease of control of liquid etching substances relative to gas etching substances. Other advantages of using a wet chemical etching process include use of straightforward and simple equipment, e.g. an etching bath, the high etching rate for a speedy etching process, and the possibility of high selectivity of the etching process, as will be explained in more detail below. An advantage of using a wet etch for a manufacturing intermediate 212 is that the dimensions of the manufacturing intermediate 212 are sufficiently compact so that it can be placed in a container comprising the substance for etching (i.e. an etching bath). Etching of the internal surface 216 of the manufacturing intermediate may comprise one or more of liquid submerging, capillary filling, or pressurized filling. These methods for inserting the etching substance into one or more of the apertures 217 are easier to apply to the manufacturing intermediate 212 than to a fiber, due to the comparatively short axial dimension and larger radial dimension of the manufacturing intermediate 212 relative to the fiber. Example etching substances may comprise hydrofluoric acid HF, a mixture of nitric acid $HNO_3$ and hydrofluoric acid HF, or potassium hydroxide KOH. These substances are able to etch silicon dioxide $SiO_2$, an example manufacturing intermediate 212 material, and therefore useful to etch the internal surface 216 of the manufacturing intermediate 212. The etching of the manufacturing intermediate 212 may be performed at room temperature. The ability to perform the etching process without requiring elevated temperatures is beneficial since it makes the method cheaper and easier to perform. However, in some instances, it may be desirable to perform the etching process at an elevated temperature, for example to obtain a specific end result.

The etching substance may comprise a gas. For example, the etching substance may comprise hydrogen fluoride (HF) gas. Using an HF gas to perform the etch provides an alternative to wet etching, so that the method may be performed in instances where a wet etch is not desirable. For example, in some instances the wet etching process may itself result in undesirable contaminants of the manufacturing intermediate 212. Additionally, or alternatively other gases able to etch the material of the internal surface 216 of the manufacturing intermediate 212 may be used.

The example manufacturing intermediate 212 shown in FIG. 8 comprises a plurality of apertures 217 extending through the elongate body 218 along an axial dimension of the elongate body 218. In this instance, the boundary of each of the plurality of apertures 217 defines a part of internal surface 216 of the manufacturing intermediate 212. The optical fiber, and the manufacturing intermediate 212 from which the fiber is drawn, may comprise a plurality of apertures 217. Alternatively, they may only comprise one aperture 217. The plurality of apertures in the fiber may collaborate to form a composite structure for guiding light. Specifically the resulting fiber is a hollow-core anti-resonant-reflecting fiber, for example, a single-ring anti-resonance hollow core fiber, or a nested tubes anti-resonance fiber. Each of the apertures 217 may for example be filled with a gas such as air, molecular gases, atomic gases, or a mixture of both molecular and atomic gases, or a vacuum.

The etching process comprises etching the internal surface 216 of at least one of the plurality of apertures 217. The etching may comprise a selective etching of the internal surface 216 of some but not all of the plurality of apertures 217. Among other methods, the selective etching of the manufacturing intermediate 212 may be achieved by blocking the apertures that are not intended for etching by a substance which is resistant to the etching agent. For example, this can be achieved by injecting a glue or a polymer in the one or more apertures that are not intended for etching. After hardening of the glue, for example in air or through exposure to specific radiation, or hardening of the polymer e.g. by using two-photon absorption in the polymer under intense radiation, the etching agent is free to enter the one or more apertures intended for etching, while it will not enter the one or more apertures blocked by the hardened glue or polymer. In another method the blocking glue or polymer may enter all the apertures via capillary action. In this case the rate of filling the apertures may be different for apertures of different sizes. After hardening, the length of the columns in apertures with different sizes are different. By cleaving/cutting the manufacturing intermediate at the right location, the apertures that are filled at a slower rate could be kept open, while the other ones remain blocked. In one embodiment only the surface which defines the hollow core of the manufacturing intermediate 212 is etched. For example, for the manufacturing intermediate 300 shown in FIG. 12, the surfaces defining the hollow core 302 (i.e. the outer surfaces of wall portions 305 and an inner surface of the support portion 308) may be etched while the inner surfaces of the capillary cavity 306 (i.e. the inner surfaces of wall portions 305) are not etched. This may be achieved by blocking the capillaries 304 using one of the above-described methods. This selective etching of the hollow core of the manufacturing intermediate 212, 300 is beneficial because capillary cavities 306 defined by the capillaries 304 may be relatively small and, therefore, it may be difficult to control the etching process with sufficient accuracy to ensure that the wall portions 305 of the capillaries 304 have uniform thickness. In turn, uniform thickness of the wall portions 305 may result in worse confinement of the guided radiation within the hollow cavity of an optical fiber drawn from the manufacturing intermediate 300.

The etching may comprise etching the internal surface 216 of all of the plurality of apertures of the manufacturing intermediate 212. The etching may further comprise etching of an external surface of the manufacturing intermediate 212. The etching may comprise etching of the whole surface, including the internal surface 216 and the external surface of the manufacturing intermediate 212. Selection of one or more apertures 217 for etching may be achieved, for example, by using capillary action to draw an etching substance into one or more selected apertures. The etching substance may be a fluid etching substance, comprising on or more of a gas and a liquid. The etching substance may be transported through an aperture using capillary action or injection of the etching agent, etching the internal surface 216 upon contact of the etching substance with the surface 216.

The etching of the internal surface 216 of the manufacturing intermediate 212 using an etching substance may comprise preferentially etching one or more portions of the internal surface 216 of the manufacturing intermediate 212 that correspond to one or more portions of the optical fiber that, in use, have dominant contact or interaction with light propagating through the optical fiber. The design and radial distribution of the one or more apertures of the optical fiber may determine the areas of the fiber that have dominant contact or interaction with the propagating radiation. Properties of the propagating radiation, for example the wavelength or wavelengths of the radiation, may further determine the distribution of the radiation inside the fiber. It will be appreciated that radiation propagating through the fiber may extend (in a transverse direction) beyond the boundaries of the one or more apertures 217, and may penetrate into the material of the fiber surrounding an aperture 217.

Figure 13:
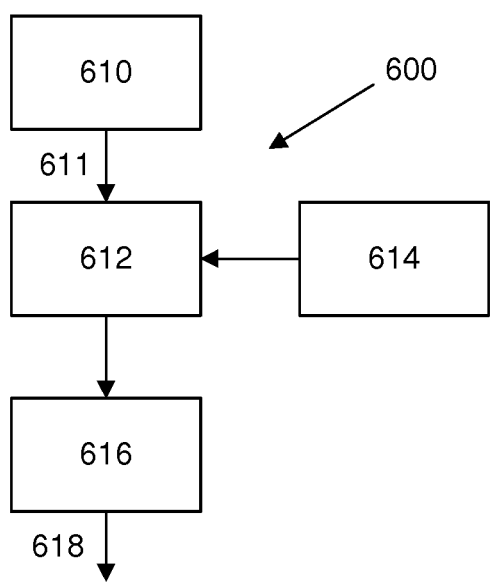
FIG. 13 depicts a schematic representation of a broadband radiation source.

In an example implementation, the optical fiber manufactured according to the method described above forms part of a supercontinuum radiation source 600 illustrated in FIG. 13. A pulse radiation source 610 is operable to produce a pulsed radiation beam 611. The pulsed radiation beam 611 may have a repetition rate in the range of, for example 1 kHz-80 MHz. The pulse radiation source 610 may comprise a laser, for example a mode-locked laser, which may be passively or actively mode locked. The radiation source may comprise one or amplification units. The pulse duration may be in the range of 10 femtoseconds to 100 picoseconds. The pulsed radiation 611 may comprise a bandwidth of wavelengths. The pulsed radiation beam 611 may be amplified using a gain medium 612 and a pump radiation source 614. The pulsed radiation, which may be amplified pulsed radiation, may be coupled into the optical fiber 616. The optical fiber 616 may act as a non-linear optical medium, for example by filling the hollow core fiber with a gas, and may be configured to broaden the spectrum of the received pulsed radiation beam so as to generate a supercontinuum radiation beam 618 at the output of the fiber. The generation of the supercontinuum radiation may be as a result of various non-linear effects, wherein the strong confinement achieved by the optical fiber contributes to the occurrence of the non-linear effects.

Further embodiments are discussed in the subsequent numbered clauses:

1. A method for forming an optical fiber, wherein the method comprises:
   providing a manufacturing intermediate having an elongate body and comprising an outer tube and a plurality of inner tubes, the plurality of inner tubes being arranged in the outer tube, the plurality of inner tubes being arranged in one or more ring structures around, and at least partially defining, an aperture extending through the elongate body along an axial dimension of the elongate body, a boundary of the aperture defining an internal surface of the manufacturing intermediate;
   etching the internal surface of the manufacturing intermediate using an etching substance; and
   drawing the manufacturing intermediate along the axial dimension so as to form the optical fiber, the optical fiber being a hollow-core anti-resonant-reflecting fiber comprising a plurality of anti-resonant elements formed from the inner tubes.
2. The method according to clause 1 wherein the plurality of inner tubes are arranged in a single ring structure around the hollow core so that each of the inner tubes is not in contact with any of the other inner tubes.
3. A method according to clause 1 or clause 2 wherein by drawing the manufacturing intermediate along an axial dimension the dimensions of the manufacturing intermediate perpendicular to the axial dimension are reduced by a factor, wherein the factor is at least 10.
4. A method according to any of the preceding clauses wherein the etching of the internal surface of the manufacturing intermediate comprises a wet chemical etching process.
5. A method according to clause 4 wherein etching of the internal surface of the manufacturing intermediate comprises one of liquid submerging, capillary filling, pressurized filling, or spray etching.
6. A method according to any of the preceding clauses wherein the etching substance comprises one of HF, a mixture of HF and $HNO_3$, or KOH.
7. A method according to any of the preceding clauses wherein the method is performed at room temperature.
8. A method according to any of clauses 1 to 3, or 5 to 7, wherein the etching of the internal surface of the manufacturing intermediate comprises a dry chemical etch.
9. A method according to any of the preceding clauses further comprising cleaning the manufacturing intermediate so as to at least partially remove the etching substance and/or any products of the etching process from within the aperture.
10. A method according to any of the preceding clauses further comprising etching an internal surface of one or more of the inner tubes of the manufacturing intermediate using the etching substance.
11. A method according to any of the preceding clauses further comprising blocking end portions of one or more of the inner tubes such that an internal surface of said inner tubes is not etched by the etching substance.
12. A method according to any of the preceding clauses wherein the etching the internal surface of the manufacturing intermediate using an etching substance comprises preferentially etching one or more portions of the internal surface of the manufacturing intermediate which correspond to one or more portions of the optical fiber that, in use, have dominant contact or interaction with light propagating through the optical fiber.
13. A method according to any of the preceding clauses further comprising etching an external surface of the manufacturing intermediate.
14. An optical fiber formed according to the method of clauses 1 to 13.
15. A manufacturing intermediate for forming an optical fiber, the manufacturing intermediate being formed as an intermediate according to the method of any of clauses 1 to 13 before the manufacturing intermediate is drawn along the axial dimension so as to form an optical fiber.
16. A supercontinuum radiation source comprising:
   a radiation source operable to produce a radiation beam; and
   an optical fiber formed according to the method of clauses 1 to 13, wherein the optical fiber is configured to receive the radiation beam and to broaden a spectrum of that pulsed radiation beam so as to generate a supercontinuum radiation beam.
17. A lithographic apparatus comprising an optical fiber formed according to the method of clauses 1 to 13.
18. A metrology apparatus comprising an optical fiber formed according to the method of clauses 1 to 13.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference may have been made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for forming an optical fiber, the method comprising:
providing a manufacturing intermediate having an elongate body and comprising an outer tube and a plurality of inner tubes, the plurality of inner tubes being arranged in the outer tube, the plurality of inner tubes being arranged in one or more ring structures around, and at least partially defining, an aperture extending through the elongate body along an axial dimension of the elongate body, a boundary of the aperture defining an internal surface of the manufacturing intermediate;
etching the internal surface of the manufacturing intermediate using an etching substance; and
drawing the manufacturing intermediate along the axial dimension so as to form the optical fiber, the optical fiber being a hollow-core anti-resonant-reflecting fiber comprising a plurality of anti-resonant elements formed from the inner tubes.

2. The method according to claim 1, wherein the plurality of inner tubes are arranged around a hollow core so that each of the inner tubes is not in direct contact with any of the other inner tubes.

3. The method according to claim 1, by drawing the manufacturing intermediate along an axial dimension, dimensions of the manufacturing intermediate perpendicular to the axial dimension are reduced by a factor, wherein the factor is at least 10.

4. The method according to claim 1, wherein the etching of the internal surface of the manufacturing intermediate comprises a wet chemical etching process.

5. The method according to claim 4, wherein etching of the internal surface of the manufacturing intermediate comprises liquid submerging, capillary filling, pressurized filling, or spray etching.

6. The method according to claim 1, wherein the etching substance comprises HF, a mixture of HF and $HNO_3$, or KOH.

7. The method according to claim 1, wherein the method is performed at room temperature.

8. The method according to claim 1, wherein the etching of the internal surface of the manufacturing intermediate comprises a dry chemical etch.

9. The method according to claim 1, further comprising etching an internal surface of one or more of the inner tubes of the manufacturing intermediate using the etching substance.

10. The method according to claim 1, wherein the etching the internal surface of the manufacturing intermediate comprises preferentially etching one or more portions of the internal surface of the manufacturing intermediate which correspond to one or more portions of the optical fiber that, in use, have dominant contact or interaction with radiation propagating through the optical fiber.

11. An optical fiber formed according to the method of claim 1.

12. A supercontinuum radiation source comprising:
a radiation source operable to produce a radiation beam; and
an optical fiber formed according to the method of claim 1, wherein the optical fiber is configured to receive the radiation beam and to broaden a spectrum of that radiation beam so as to generate a supercontinuum radiation beam.

13. A lithographic apparatus comprising an optical fiber formed according to the method of claim 1.

14. A metrology apparatus comprising an optical fiber formed according to the method of claim 1.

15. A method for producing a manufacturing intermediate to form an optical fiber, the method comprising:
providing a manufacturing intermediate having an elongate body and comprising an outer tube and a plurality of inner tubes, the plurality of inner tubes being arranged in the outer tube, the plurality of inner tubes being arranged in one or more ring structures around, and at least partially defining, an aperture extending through the elongate body along an axial dimension of the elongate body, a boundary of the aperture defining an internal surface of the manufacturing intermediate; and
etching the internal surface of the manufacturing intermediate using an etching substance.

16. The method according to claim 15, wherein the etching of the internal surface of the manufacturing intermediate comprises a wet chemical etching process, and the etching of the internal surface of the manufacturing intermediate comprises liquid submerging, capillary filling, pressurized filling, or spray etching.

17. The method according to claim 15, wherein the etching substance comprises HF, a mixture of HF and $HNO_3$, or KOH.

18. The method according to claim 15, wherein the method is performed at room temperature.

19. The method according to claim 15, further comprising etching an internal surface of one or more of the inner tubes of the manufacturing intermediate using the etching substance.

20. The method according to claim 15, wherein the plurality of inner tubes are arranged around a hollow core so that each of the inner tubes is not in direct contact with any of the other inner tubes.

21. A manufacturing intermediate for forming an optical fiber, the manufacturing intermediate formed according to the method of claim 15.

* * * * *